(12) United States Patent
Iwamoto et al.

(10) Patent No.: US 6,762,533 B2
(45) Date of Patent: Jul. 13, 2004

(54) SURFACE ACOUSTIC WAVE DEVICE

(75) Inventors: Takashi Iwamoto, Kusatsu (JP); Yoshihiro Koshido, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/847,989

(22) Filed: May 3, 2001

(65) Prior Publication Data

US 2001/0052736 A1 Dec. 20, 2001

(30) Foreign Application Priority Data

May 19, 2000 (JP) ........................ 2000-148850

(51) Int. Cl.$^7$ ............... H01L 41/04; H01L 41/08; H01L 41/18; H02N 2/00
(52) U.S. Cl. ............... 310/313 B; 310/313 R; 310/311
(58) Field of Search ........................ 310/313 B, 313 R, 310/311, 300

(56) References Cited

U.S. PATENT DOCUMENTS

| | | | |
|---|---|---|---|
| 3,801,935 A | * 4/1974 | Mitchell ........................ 333/72 |
| 4,017,890 A | * 4/1977 | Howard et al. ............ 257/768 |
| 4,223,284 A | * 9/1980 | Inoue et al. ................ 333/150 |
| 4,425,554 A | * 1/1984 | Morishita et al. .......... 333/195 |
| 4,775,814 A | * 10/1988 | Yuhara et al. .......... 310/313 R |
| 5,091,051 A | * 2/1992 | Greer ......................... 216/65 |
| 5,171,642 A | * 12/1992 | DeHaven et al. ........... 428/620 |
| 5,260,913 A | * 11/1993 | Kadota et al. .............. 367/140 |
| 5,283,037 A | * 2/1994 | Baer et al. ................ 422/82.01 |
| 5,363,073 A | * 11/1994 | Higgins ....................... 333/195 |
| 5,363,074 A | * 11/1994 | Higgins, Jr. ................ 333/195 |
| 5,585,770 A | * 12/1996 | Higgins, Jr. ................ 333/193 |
| 5,684,437 A | * 11/1997 | Ago et al. .................. 333/195 |
| 5,708,403 A | * 1/1998 | Morozumi et al. ........ 333/194 |
| 5,793,147 A | * 8/1998 | Kadota et al. .......... 310/313 R |
| 5,793,266 A | * 8/1998 | Allen et al. ................. 333/193 |
| 5,838,217 A | * 11/1998 | Kadota et al. .............. 333/193 |
| 5,874,868 A | * 2/1999 | Shimoe ....................... 333/193 |
| 5,953,433 A | * 9/1999 | Fujimoto et al. ........... 381/337 |
| 5,977,686 A | * 11/1999 | Kadota et al. .......... 310/313 B |
| 5,990,762 A | * 11/1999 | Nakamura et al. .......... 333/195 |
| 6,088,462 A | * 7/2000 | Fujimoto et al. ........... 381/160 |
| 6,121,860 A | * 9/2000 | Tsutsumi et al. ........... 333/195 |
| 6,127,769 A | * 10/2000 | Kadota et al. .......... 310/313 B |
| 6,150,900 A | * 11/2000 | Kadota et al. .............. 333/133 |
| 6,218,763 B1 | * 4/2001 | Fujimoto et al. ........ 310/313 R |
| 6,259,185 B1 | * 7/2001 | Lai ........................... 310/313 B |
| 6,271,617 B1 | * 8/2001 | Yoneda et al. .......... 310/313 D |
| 6,346,864 B1 | * 2/2002 | Kadota ....................... 333/133 |
| 6,353,371 B1 | * 3/2002 | Kadota et al. .............. 333/133 |
| 6,369,491 B1 | * 4/2002 | Nakagawa et al. ......... 310/364 |
| 6,369,667 B1 | * 4/2002 | Kadota et al. .............. 333/133 |
| 6,437,668 B1 | * 8/2002 | Nakao et al. ............... 333/193 |
| 6,452,305 B1 | * 9/2002 | Mellen et al. .......... 310/313 R |
| 6,545,388 B2 | * 4/2003 | Iwamoto ................ 310/313 A |
| 6,600,391 B2 | * 7/2003 | Kadota et al. .............. 333/193 |
| RE38,278 E | * 10/2003 | Satoh et al. ............. 310/313 R |
| 6,637,087 B1 | * 10/2003 | Horiuchi et al. .......... 29/25.35 |

FOREIGN PATENT DOCUMENTS

| | | |
|---|---|---|
| EP | 0 936 734 A1 | 8/1999 |
| GB | 2 341 024 A | 3/2000 |
| JP | 62-168410 | 7/1987 |
| JP | 10-247835 | 9/1998 |
| JP | 11-74751 | 3/1999 |
| JP | 11-234082 | 8/1999 |
| JP | 2000-138551 | 5/2000 |

\* cited by examiner

Primary Examiner—Burton S. Mullins
Assistant Examiner—Pedro J. Cuevas
(74) Attorney, Agent, or Firm—Keating & Bennett, LLP

(57) ABSTRACT

A surface acoustic wave device which utilizes excitation of a shear horizontal wave includes a piezoelectric substrate and an interdigital transducer provided on the piezoelectric substrate. The interdigital transducer includes at least three metal layers containing at least one first layer made of a metal with a density of approximately 15 g/cm$^3$ or more as a major component and at least one second layer made of a metal with a density of about 12 g/cm$^3$ or less. The volume of the first layer being in the range from about 20% to about 95% of the total volume of the interdigital transducer or the reflector.

16 Claims, 2 Drawing Sheets

SURFACE ACOUSTIC WAVE DEVICE

BACKGROUND OF THE INVENTION

1. Field of the Invention

The present invention relates to a surface acoustic wave device, and more particularly, to a surface acoustic wave device that is especially useful as a band filter or a resonator.

2. Description of the Related Art

Conventionally, surface acoustic wave devices are widely used as a band filter and a resonator. For surface acoustic wave devices to be used in these fields, it is strongly required to have a good frequency characteristic. In the case in which an interdigital transducer (hereinafter, referred to as IDT), and a reflector are arranged as a film on a surface acoustic wave device, the larger the film thickness is, the longer the film-forming time is, and moreover, it is more difficult to obtain a uniform film thickness. Thus, it is desired that the film thicknesses of the IDT and the reflector are small.

Accordingly, in surface acoustic wave devices using an shear horizontal or SH wave, metals having a high density such as Au, W, Ta, Pt, and so forth are used for the IDTs and the reflectors in many cases. When a metal material having a large density such as Au is used for the IDTs and the reflectors, which have a small film thickness, can easily excite and reflect an SH wave. Thus, the thicknesses of the IDTs and the reflectors can be reduced.

Moreover, when plural surface acoustic wave devices (especially, surface acoustic wave devices for use as narrow-band filters) are produced, it is desired that dispersions in center frequency between the respective surface acoustic wave devices are as small as possible. Accordingly, regarding surface acoustic wave devices having IDTs and reflectors using metals with a high density such as Au, W, Ta, Pt, dispersions in frequency between the respective surface acoustic wave devices in the same wafer are suppressed by making the film-thicknesses of the IDTs and the reflectors as uniform as possible when the IDTs and the reflectors are film-formed.

However, techniques for making uniform the thicknesses of the IDTs and the reflectors have a limitation. Therefore, when a plurality of surface acoustic wave devices are produced on the same wafer at one time, dispersions in frequency between the respective surface acoustic wave devices become large. Therefore, even if the metal materials having a high density such as Au, W, Ta, Pt, are used, practically it is necessary to adjust the frequencies of the finished surface acoustic wave devices, individually.

Thus, though it is assumed that the metal materials having a high density such as Au, W, Ta, Pt, are desirably used to produce the IDTs and the reflectors of the surface acoustic wave devices using an SH wave, it is necessary to adjust the frequencies individually. Thus, the throughput is reduced, which increases the cost.

As a method of adjusting the frequencies of the surface acoustic wave devices, individually, a method of etching the surfaces of the IDTs and the reflectors by use of ion beams, a method of forming films as insulators between substrates, the IDTs, and the reflectors, a method of etching the substrates, the IDTs, and the reflectors according to RIE (reaction ion etching), and so forth, are generally used. For this reason, when the frequencies are adjusted by use of ion beams or the like, the IDTs, the reflectors, and the substrates suffer damage, which deteriorate the characteristics of the surface acoustic wave devices.

When plural surface acoustic wave devices are produced using the same wafer, dispersions in center frequency can be reduced by use of metal materials having a high density such as Ni, Al, Cr, Cu, for the IDTs and the reflectors. However, the metal materials such as Ni, Al, are difficult to excite and reflect an SH wave. Thus, filters and resonators having a good frequency characteristic can be obtained but with great difficulty. The metal materials are not suitable as materials for the IDTs and the reflectors.

SUMMARY OF THE INVENTION

In order to solve the problems described above, preferred embodiments of the present invention provide a surface acoustic wave device utilizing an SH wave which minimizes dispersions in center frequency, so that it is not necessary to adjust the frequency after the IDT and the reflector are produced.

The surface acoustic wave device according to a preferred embodiment of the present invention utilizes excitation of an SH wave, and includes an interdigital transducer or a reflector defined by a laminated body including at least total three metal layers having at least one first layer made of a metal with a density of at least about 15 g/cm$^3$ as a major component and at least one second layer made of a metal with a density of up to about 12 g/cm$^3$ on a piezoelectric substrate, the volume of said first layer being in the range from about 20% to about 95% of the total volume of the interdigital transducer or the reflector. The first and second layers are preferably formed, e.g., by vapor deposition or sputtering.

The surface acoustic wave device according to preferred embodiments of the present invention is preferably used as a filter, a resonator or other electronic component utilizing an SH wave. The second-layer containing a metal with a density of up to about 12 g/cm$^3$ such as Ni, Cr, Cu, Al, Ti, or other suitable material is sandwiched between the first layers containing as a major component a metal with a density of at least about 15 g/cm$^3$ such as Au, W, Ta, Pt, or other suitable material. The second layer is a metal layer having a small effect of reducing the propagation velocity of a surface acoustic wave on the piezoelectric substrate. Since the second layer is sandwiched between the first layers, dispersions in frequency of the IDT or the reflector, caused by dispersions in film thickness thereof, are minimized. Thus, excellent resonator and filter characteristics are achieved.

Accordingly, in the case in which a plurality of surface acoustic wave devices are formed on the same wafer, frequency adjustment of the individual surface acoustic wave devices is unnecessary. The cost of the surface acoustic wave device can be reduced, due to the enhanced throughput. Moreover, the frequency adjustment by ion beam etching or other suitable process is not required. Thus, damage to the piezoelectric substrate, the IDT, and the reflector is prevented, and moreover, the acceptance ratio of the surface acoustic wave devices is greatly improved.

The volume of the first layer is preferably in the range of from about 20% to 95% of the overall volume of the IDT or the reflector. To decrease the film-thickness of the IDT or the reflector, desirably, the ratio of the first layer is high. For this reason, preferably, at least two first-layers are contained in the IDT or the reflector.

In the surface acoustic wave device of preferred embodiments of the present invention, preferably, in the layers lying in the range of the thickness of up to one-fourth of the total thickness of the interdigital transducer or the reflector measured from the surface of the piezoelectric substrate of the metal layers constituting the interdigital transducer or the reflector, the first-layer has a volume of at least about 50%. Moreover, preferably, the metal layer disposed directly on the piezoelectric substrate is the first layer or the second layer which has a small thickness. That is, preferably, of the layers each having a thickness of at least about one-twentieth of the total thickness of the interdigital transducer or the reflector, the layer located nearest to the piezoelectric substrate is the first-layer. Moreover, preferably, the surface of the IDT or the reflector includes the first layer.

In particular, according to another preferred embodiment of the present invention, preferably, the first layer contains Au as a major component and has a volume of from about 40% to about 80% of the total volume, and the second layer contains Ni as a major component and has a volume of from about 20% to about 60% of the overall volume.

According to another preferred embodiment of the present invention, the first layer contains Au as a major component and has a volume of from about 20% to about 50% of the overall volume, and the second layer contains Al as a major component and has a volume of from about 50% to about 80%.

According to preferred embodiments of the present invention, at least two of the first layers with a high density having a high effect of decreasing the propagation velocity of a surface acoustic wave on a piezoelectric substrate, and the second layer with a low density having a small effect of decreasing the propagation velocity of the surface acoustic wave on the piezoelectric substrate, that is, being capable of decreasing dispersions in frequency caused by dispersions in film thickness are arranged so as to have a laminated structure. Thereby, excellent resonator and filter characteristics are obtained. Moreover, dispersions in center frequency between plural surface acoustic wave devices produced in the same wafer are minimized.

Accordingly, it becomes unnecessary to carry out the frequency adjustment individually, which has been conventionally needed. Significant improvement in throughput can be realized. Furthermore, cost reduction can be achieved. Moreover, damage and sticking of foreign matters to the piezoelectric substrate caused by frequency adjustment can be eliminated. This is advantageous from the standpoint of characteristics. The acceptance ratio is greatly increased.

Other features, elements, characteristics and advantages of the present invention will become apparent from the following detailed description of preferred embodiments of the present invention with reference to the attached drawings.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, specific embodiments of the present invention will be described with reference to the drawings.

Figure 1:
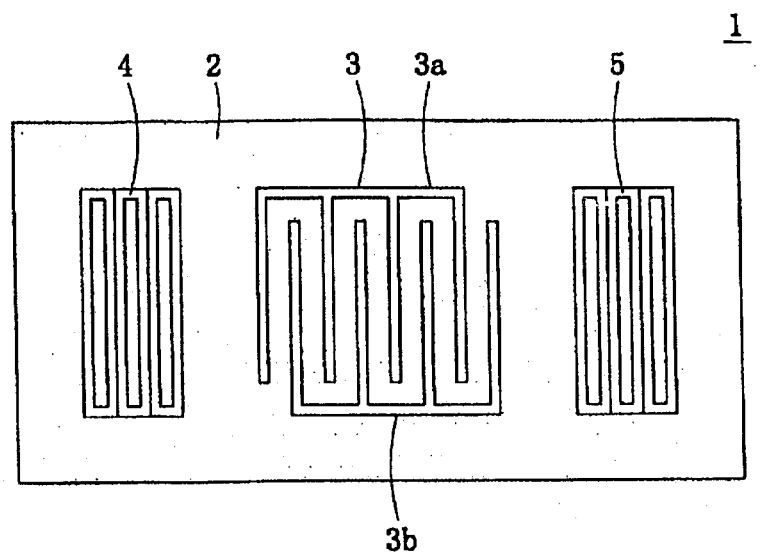
FIG. 1 is a schematic plan view of a surface acoustic wave device according to a preferred embodiment of the present invention.

FIG. 1 is a schematic plan view of a surface acoustic wave device 1 according to a preferred embodiment of the present invention. In the surface acoustic wave device 1, an IDT 3 is provided on the surface of a piezoelectric substrate 2 such as a quartz substrate or other suitable substrate. The IDT 3 includes a pair of interdigital electrodes 3a and 3b. The electrode portions of both of the interdigital electrodes 3a and 3b are alternately disposed so as to be engaged with each other. Moreover, the electrode portions of the IDT 3 are extended in a direction that is substantially perpendicular to the surface acoustic wave propagation direction. In the surface acoustic wave propagation direction of the IDT 3, reflectors 4 and 5 are arranged on both of the sides of the IDT 3. The reflectors 4 and 5 are grating type reflectors, and have the configuration in which the plurality of electrode portions each are short-circuited in both of the ends thereof. Moreover, the surface acoustic wave device 1 is a surface acoustic wave resonator utilizing a surface acoustic wave, that is, an SH wave such as a Love wave.

Referring to the above-described surface acoustic wave device 1, when an electric signal is applied across the interdigital electrodes 3a and 3b, the portion of the piezoelectric substrate 2 on which the IDT 3 is provided is excited so that a surface acoustic wave is generated. The surface acoustic wave is propagated on the surface of the piezoelectric substrate 2, which is a uniform propagation medium, to both of the sides of the IDT 3, that is, to reach the respective reflectors 4 and 5. The portions of the IDT 3 where the reflectors 3 and 4 are located have a propagation constant that is different from that of the other portion of the IDT 3. Thus, a portion of the surface acoustic wave, which reaches the reflectors 4 and 5, is reflected therefrom.

In the case in which the surface acoustic wave has a wavelength $\lambda$ that is substantially equal to about two times the interval $\lambda/2$ between the respective electrode portions of the reflectors 4 and 5, reflection waves from the electrode portions of the reflectors 4 and 5 are intensified with each other and become strong reflection waves.

The reflection waves intensified as described above are propagated in reciprocation between the reflectors 4 and 5, whereby resonance action can be obtained.

Figure 2:
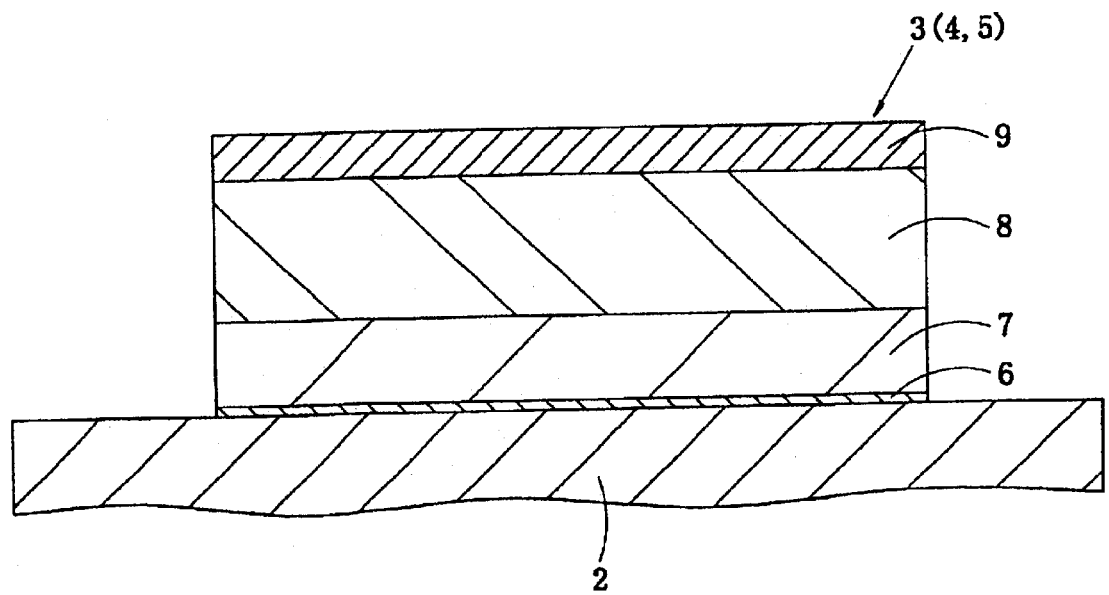
FIG. 2 is a cross-sectional view schematically showing the structure of IDT provided on the surface acoustic wave device.

FIG. 2 is a cross sectional view schematically showing the film structure of the IDT 3 (or the interdigital electrodes 3a and 3b). In the IDT 3, a Ti film 6 (second layer) with a film thickness of about 5 nm, for example, is formed on the surface of the piezoelectric substrate 2 thereon, an Au film 7 (first layer) with a film thickness of about 150 nm, for example, is film-formed thereon, an Ni film 8 (second film) with a film thickness of about 200 nm, for example, is formed thereon, and an Au film 9 (first layer) with an film thickness of about 50 nm, for example, is formed. Thus, the IDT 3 preferably has a four-layer structure in this example.

The reflectors 4 and 5 have the same film structure as described above, which is not shown. Thereby, the IDT 3 and the ref lectors 4 and 5 can be produced at the same time. Thus, a process for producing the IDT 3 and the reflectors 4 and 5 can be simplified.

The IDT 3, and the reflectors 4 and 5 having the above-described film-structure are produced in an EB (electron beam) vapor deposition method and a liftoff process. In particular, a photosensitive resin (photoresist) is applied to the surface of a piezoelectric substrate 2 (wafer). Thereafter, the photosensitive resin is patterned, so that openings corresponding to the IDT 3 and the reflectors 4 and 5 are formed. Then, films of Ti, Au, Ni, and Au are sequentially formed on the photosensitive resin in an EB vapor deposition method to form a Ti layer 6, an Au layer 7, an Ni layer 8, and an Au layer 9. Thereafter, the photosensitive resin is released, and simultaneously, the four layer metal films in the unnecessary areas are removed, so that the IDT 3 and the reflectors 4 and 5 are patterned.

Figure 3:
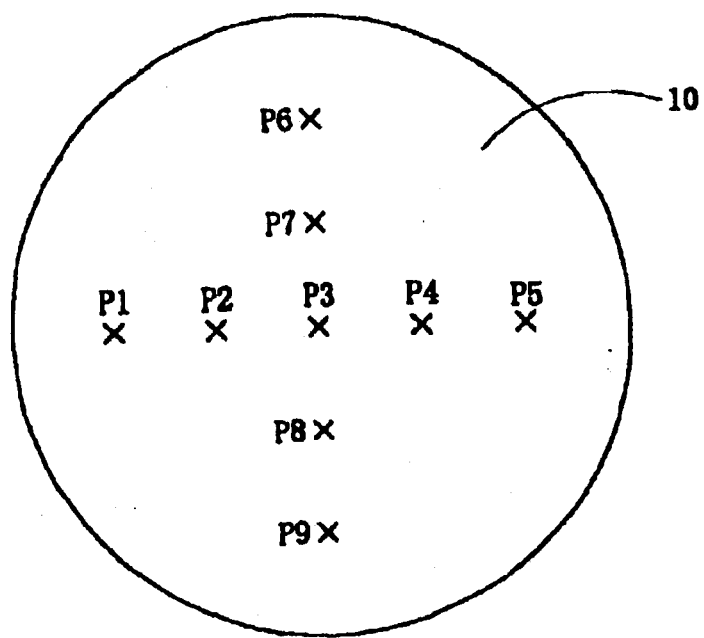
FIG. 3 illustrates measurement points on a wafer used to obtain the data of Table 1.

The following Table 1 shows the measurement results obtained when the plurality of surface acoustic wave devices 1 having the above-described electrode structure are formed on the same wafer 10, and the insertion losses and the center frequencies of the respective surface acoustic wave devices 1 are measured at respective points P1 to P9 inside of the wafer 10 as shown in FIG. 3. Moreover, FIG. 1 shows the maximum value (MAX), the minimum value (MIN), and the average (AVE) of the insertion losses, and the deviation ($\sigma$) of the center frequency.

Moreover, Table 1 shows the measurement results obtained when a plurality of conventional surface acoustic wave devices were formed on the same wafer by use of the same wafer and the same film-forming apparatus, and the insertion losses and the center frequencies of the conventional surface acoustic wave devices were measured at the same points P1 to P9 inside of the wafer. In the conventional surface acoustic wave devices, the IDTs and the reflectors each having a two-layer structure (Au/Ti) including a Ti film as an adhesion layer on the surface of the piezoelectric substrate and an Au film as a main component of the electrodes are provided.

| MEAS-UREMENT POINT | CONVENTIONAL EXAMPLE Au/Ti/SUBSTRATE | | PRESENT INVENTION Au/Ti/Au/Ti SUBSTRATE | |
|---|---|---|---|---|
| | INSERTION LOSS (dB) | CENTRAL FREQUENCY (MHz) | INSERTION LOSS (dB) | CENTER FREQUENCY (MHz) |
| P1 | −3.51 | 200.74 | −3.23 | 200.43 |
| P2 | −3.61 | 200.49 | −3.18 | 200.19 |
| P3 | −3.48 | 199.63 | −3.2 | 199.91 |
| P4 | −3.55 | 200.01 | −3.48 | 200.03 |
| P5 | −3.34 | 200.64 | −3.09 | 200.29 |
| P6 | −3.41 | 200.79 | −3.35 | 200.37 |
| P7 | −3.72 | 200.48 | −3.31 | 200.15 |
| P8 | −3.82 | 199.81 | −3.28 | 200.14 |
| P9 | −3.54 | 200.93 | −3.28 | 200.37 |
| TOTAL | MAX −3.82 MIN −3.41 AVE −3.55 | 3$\sigma$ 0.4627 | MAX −3.48 MIN −3.09 AVE −3.27 | 3$\sigma$ 0.1722 |

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device utilizing a Shear Horizontal wave, comprising:
   a piezoelectric substrate; and
   an interdigital transducer provided on the piezoelectric substrate, the interdigital transducer including at least three metal layers containing at least two first layers made of a metal with a density of about 15 g/cm$^3$ or more as a major component and at least one second layer made of a metal with a density of about 12 a/cm$^3$ or less, the volume of said first layer being in the range from about 20% to about 95% of the total volume of the interdigital transducer.

2. A surface acoustic wave device according to claim 1, wherein the metal with a density of at least about 15 g/cm$^3$ constituting the first layer as a major component is one of Au, W, Ta, and Pt.

3. A surface acoustic wave device according to claim 1, wherein the metal with a density of up to about 12 g/cm$^3$ constituting the second layer as a major component is one of Ni, Cr, Cu, Al, and Ti.

4. A surface acoustic wave device according to claim 1, wherein, in the layers that are within a range of thickness of up to approximately one-fourth of the total thickness of the interdigital transducer measured from the surface of the piezoelectric substrate of the metal layers constituting the interdigital transducer, the first layer has a volume of at least 50% of the total volume.

5. A surface acoustic wave device according to claim 1, wherein in the layers each having a thickness of at least about one-twentieth of the total thickness of the interdigital transducer in the metal layers constituting the interdigital transducer, the layer located nearest to the piezoelectric substrate is the first layer.

6. A surface acoustic wave device according to claim 1, wherein the first layer is arranged at the surface of the interdigital transducer.

7. A surface acoustic wave device according to claim 1, further comprising reflectors are arranged on both of the sides of the IDT.

8. A surface acoustic wave device according to claim 7, wherein the reflectors are grating type reflectors, and have the configuration in which the plurality of electrode portions each are short-circuited in both of the ends thereof.

9. A surface acoustic wave device according to claim 7, wherein portions of the IDT where the reflectors are located have a propagation constant that is different from that of the remaining portion of the IDT.

10. A surface acoustic wave device according to claim 7, wherein the first layer includes a Ti film and the second layer includes an Au film.

11. A surface acoustic wave device according to claim 7, wherein the IDT has a four layer structure.

12. A surface acoustic wave device according to claim 11, wherein the four layer structure of the IDT includes films of Ti, Au, Ni, and Au.

13. A surface acoustic wave device according to claim 1, wherein a first of the at least three layers includes Au as a major component and a second of the at least three layers includes Ni as a major component.

14. A surface acoustic wave device according to claim 13, wherein in the interdigital transducer, the layer containing Au as a major component has a volume of from about 40% to about 80% of the overall volume, and the layer containing Ni as a major component has a volume of from about 20% to about 60% of the overall volume.

15. A surface acoustic wave device according to claim 1, wherein a first of the at least three layers includes Au as a major component and a second of the at least three layers includes Al as a major component.

16. A surface acoustic wave device according to claim 15, wherein in the interdigital transducer, the layer containing Au as a major component has a volume of from about 20% to about 50% of the overall volume, and the layer containing Al as a major component has a volume of from about 50% to about 80% of the overall volume.

* * * * *